United States Patent [19]

Venes

[11] Patent Number: 5,668,501
[45] Date of Patent: Sep. 16, 1997

[54] TRANSCONDUCTANCE AMPLIFIER HAVING A DIGITALLY VARIABLE TRANSCONDUCTANCE AS WELL AS A VARIABLE GAIN STAGE AND AN AUTOMATIC GAIN CONTROL CIRCUIT COMPRISING SUCH A VARIABLE GAIN STAGE

[75] Inventor: Arnoldus G. W. Venes, Eindhoven, Netherlands

[73] Assignee: U.S. Philips Corporation, New York, N.Y.

[21] Appl. No.: 522,039

[22] Filed: Aug. 31, 1995

[30] Foreign Application Priority Data

Sep. 1, 1994 [EP] European Pat. Off. ............... 94202501

[51] Int. Cl.⁶ .................... H03F 3/45; H03G 3/30
[52] U.S. Cl. .................... 330/254; 330/257; 330/282; 330/288
[58] Field of Search ................... 330/254, 257, 330/282, 288

[56] References Cited

U.S. PATENT DOCUMENTS 4,361,815  11/1982  Schade, Jr. ................ 330/257 X
5,051,707   9/1991  Fujita ........................ 330/282 X
5,327,298   7/1994  Molina et al. .............. 330/254

OTHER PUBLICATIONS

IEEE Journal of Solid-State circuits, vol. SC-17, No. 3, Jun. 1982, p. 522.

Primary Examiner—James B. Mullins
Attorney, Agent, or Firm—Bernard Franzblau

[57] ABSTRACT

A transconductance amplifier having a digitally variable transconductance includes a differential stage having a first differential output coupled to an output terminal via a first current mirror and a second differential output coupled to the output terminal via a second and third current mirror. The first and third current mirrors have multiple output branches for selectively supplying output currents to the output terminal in response to a binary transconductance control signal. In this way a digital control of the variable transconductance is realised, which can be used advantageously in a variable gain stage and in an automatic gain control circuit including such a variable gain stage.

6 Claims, 2 Drawing Sheets

TRANSCONDUCTANCE AMPLIFIER HAVING A DIGITALLY VARIABLE TRANSCONDUCTANCE AS WELL AS A VARIABLE GAIN STAGE AND AN AUTOMATIC GAIN CONTROL CIRCUIT COMPRISING SUCH A VARIABLE GAIN STAGE

BACKGROUND OF THE INVENTION

This invention relates to a transconductance amplifier having a variable transconductance, said transconductance amplifier comprising a non-inverting and an inverting input terminal, an output terminal and a control input for controlling said variable transconductance, said input terminals being coupled to respective inputs of a differential stage, said differential stage having a first differential output coupled to said output terminal via a first output branch of a first current mirror and a second differential output coupled to said output terminal via a second current mirror and a first output branch of a third current mirror.

The invention also relates to a variable gain stage comprising an operational amplifier having a non-inverting and an inverting input terminal and an output terminal and a gain control input, said gain stage comprising a resistive ladder coupled between said output terminal and a reference terminal, said inverting input terminal being selectively connectable to one of a plurality of taps of said resistive ladder in response to a binary gain control signal applied to said gain control input for digitally controlling the gain of said variable gain stage.

The invention further relates to an automatic gain control circuit comprising a variable gain stage coupled to a peak detector, an output signal of said peak detector being applied to a gain control input of said variable gain stage.

A transconductance amplifier as described in the opening paragraph is known from IEEE Journal of Solid-State circuits, Vol. SC-17, No. 3, June 1982, page 522. The known transconductance amplifier comprises a differential stage having a first and a second output branch, each of these branches carrying a common-mode current and a differential current proportional to the difference between the voltages on the input terminals. The two current branches only differ in that the differential current in the first branch is opposite in sign to the differential current in the second branch. By subtracting the currents at the output terminal only the summed differential currents will appear at this output terminal. By changing the tail current of the differential stage the transconductance of the transconductance amplifier is made variable using an analogue control signal.

In mixed analogue and digital applications it is, however, desirable to be able to change the transconductance in response to a binary control signal. This usually involves using a D/A converter for converting the binary control signal into an analogue control signal. A drawback of this method is that a D/A converter is needed.

SUMMARY OF THE INVENTION

An object of the invention is to provide a transconductance amplifier with a transconductance which is digitally variable.

Another object of the invention is to provide a variable gain stage comprising a transconductance amplifier according to the invention.

A further object of the invention is to provide an automatic gain stage comprising a variable gain stage according to the invention.

The first-mentioned object is achieved by a transconductance amplifier according to the invention, which is characterised in that said first and third current mirrors comprise further output branches, the further output branches being coupled to said output terminal for selectively supplying output currents to said output terminal in response to a binary transconductance control signal applied to said control input. By providing the first and third current mirrors with extra output branches, supplying extra switchable output currents, it is possible to control the transconductance of the amplifier digitally, using a binary control signal. A further advantage is that due to the symmetrical lay-out the common-mode voltage on the output terminal is not affected by a change in transconductance. Since the transconductance is changed by switching on or off extra output branches of the first and third current mirrors, no effect of a change in transconductance will be seen at the input terminals of the transconductance amplifier.

An embodiment of the transconductance amplifier according to the invention is characterised in that said first output branches of the first and third current mirrors are coupled to said output terminal for selectively supplying output currents to said output terminal in response to said binary transconductance control input signal. By coupling the output currents of the first outputs of the first and third current mirrors to said output terminal for selectively supplying output currents to said output terminal in response to said binary transconductance control signal, it is possible to reduce the value of the transconductance to substantially zero by reducing the output current to zero irrespective of the signal applied to the input terminals of the transconductance amplifier, whereas without this measure a non zero output current would always be supplied to the output terminal as the first output branches of the first and third current mirrors would always be connected to the output terminal.

An embodiment of the transconductance amplifier according to the invention is charaeterised in that said further output branches of the first and third current mirrors are coupled to said output terminal via respective switches, said switches being operable in response to said binary transconductance control signal. In this embodiment the output branches of the current mirrors are connected to the output terminal via switches.

An embodiment of the transconductance amplifier according to the invention is characterised in that said output currents of said output branches of the first and third current mirrors are controlled by first and second bias signals respectively, said bias signals being applied to respective control electrodes of output current mirror transistors via respective switches for selectively receiving said respective bias signal in response to said binary transconductance control signal. In this alternative embodiment the output branches are permanently connected to the output terminal. The output current is changed by selectively applying bias voltages to the control electrode of the pertinent transistors in the output branches.

A variable gain stage according to the invention is characterised in that said operational amplifier is the transconductance amplifier of claim 1, 2, 3 or 4, and in that the transconductance of said transconductance amplifier is changed in accordance with a change of the gain of said variable gain stage. A variable gain stage having a fixed high transconductance can become unstable at low gain values as the bandwidth will be very large. By decreasing the transconductance of the transconductance amplifier at low gain values, the bandwidth of the variable gain stage is reduced accordingly, thereby effectively avoiding instability. At high gain values the bandwidth is automatically lower than at low gain values, thus allowing a high value for the transconductance.

An advantageous embodiment of the variable gain stage according to the invention is characterised in that said binary gain control signal and the binary transconductance control signal are the same signal.

An automatic gain control circuit according to the invention is characterised in that said variable gain stage is coupled to said peak detector via an A/D converter and in that said variable gain stage is the variable gain stage of claim 5 or 6. By using a variable gain stage having a digitally controllable gain, an automatic gain control circuit can be realised using mixed analogue and digital techniques.

BRIEF DESCRIPTION OF THE DRAWINGS

The above and other features and advantages of the invention will be apparent from the following description of exemplary embodiments of the invention with reference to the accompanying drawings, in which.

DESCRIPTION OF THE PREFERRED EMBODIMENTS

Figure 1:
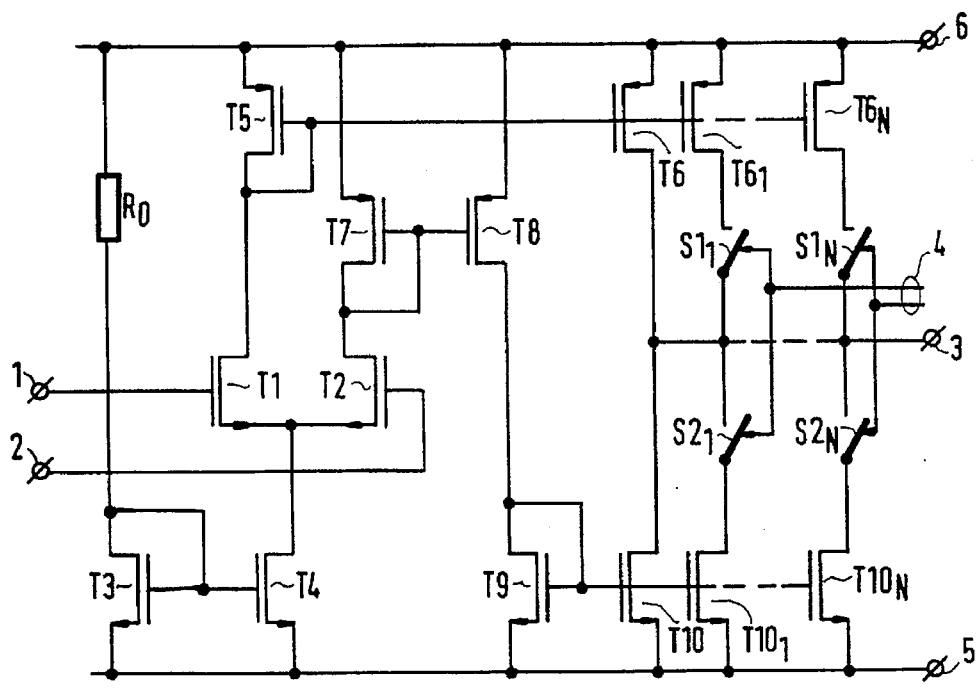
FIG. 1 is a circuit diagram of a first embodiment of a transconductance amplifier according to the invention using MOS transistors.

FIG. 1 shows a first embodiment of a transconductance amplifier according to the invention using MOS transistors. The transconductance amplifier comprises a differential stage of transistors T1 and T2 whose sources are mutually coupled to the output of a current source supplying a constant current. The current source is realised by transistor T4, which is biased via resistor R0 and transistor T3. The resistor R0 is coupled between a positive power supply terminal 6 and the drain and gate of transistor T3, the source of transistor T3 being coupled to a reference terminal 5. The gate of transistor T3 is connected to the gate of transistor T4, the source of transistor T4 is coupled to the reference terminal 5 and the drain of transistor T4 is connected to the sources of transistors T1 and T2. The current through resistor R0 is mirrored via transistor T3 to the drain of transistor T4. The current source can be implemented in other ways as long as a constant current is supplied to the sources of transistors T1 and T2. A drain of transistor T1, representing a first differential output of the differential stage, is coupled to an input branch of a first current mirror, comprising transistor T5 as input stage, having its gate and drain connected to the drain of transistor T1, and comprising transistors T6, $T6_1$ . . . $T6_N$ as output stages, having their gates coupled to the gate of transistor T5. A first output branch of the first current mirror, represented by a drain of transistor T6, is connected to an output terminal 3. Further output branches, i.e. the drains of transistors $T6_1$ . . . $T6_N$, are coupled to the output terminal 3 via respective switches $S1_1$ . . . $S1_N$. A drain of transistor T2, representing a second differential output of the differential stage, is coupled to an input branch of a second current mirror, comprising transistor T7 as input stage, having its drain and gate connected to said second differential output, and further comprising transistor T8 as output stage. The gate of transistor T8 is connected to the gate of transistor T7 and the drain is connected to the input of a third current mirror. Said third current mirror comprises transistor T9 as the input branch, having its gate and drain connected to the drain of transistor T8, and further comprises transistors T10, $T10_1$ . . . $T10_N$ as output branches, having their gates coupled to the gate of transistor T9. A first output branch of the third current mirror, represented by a drain of transistor T10, is connected to the output terminal 3. Further output branches, i.e. the drains of transistors $T10_1$ . . . $T10_N$, are coupled to the output terminal 3 via respective switches $S2_1$ . . . $S2_N$. Transistors T1 . . . T4, T9, T10, $T10_1$ . . . $T10_N$ are N-channel MOS transistors and transistors T5 . . . T8, $T6_1$ . . . $T6_N$ are P-channel MOS transistors. At the first differential output of the differential stage a first output current flows proportional to a common-mode current, supplied by the current source T4, and a differential current, proportional to the differential input voltage across the input terminals 1 and 2. At the second output of the differential stage a second output current flows opposite to the first output current. The output current supplied by transistor T6 is a scaled copy of the first output current at the first differential output of the differential stage and the output current supplied by transistor T10 is a scaled copy of the second output current at the second differential output of the differential stage, the scaling factors for both copies being substantially the same. Subtracting these two currents at the output terminal 3 results in an output current being proportional only to the differential current of the differential stage as the common-mode currents cancel each other. By operating switches $S1_1$ and $S2_1$ simultaneously an extra output current is added to the output current supplied by transistors T6 and T10. By operating switches $S1_i$ and $S2_i$ simultaneously (where i stands for any variable in the range of 1 to N), an extra output current can be supplied to the output terminal 3. Thus, the total output current can be changed by a suitable operation of the pairs of switches $(S1_1, S2_1), \ldots, (S1_N, S2_N)$. These switches are operated by applying a binary transconductance control signal to the control input 4 of the transconductance amplifier. This binary control signal consists of N bits, said bits switching the pairs of switches $(S1_1, S2_1), \ldots, (S1_N, S2_N)$ on or off. Thus a plurality of combinations is possible to obtain a digitally controllable transconductance. By a suitable scaling of the transistors T6, $T6_1$ . . . $T6_N$ and T10, $T10_1$ . . . $T10_N$ the characteristic of the controllable transconductance can be chosen at will.

Figure 2:
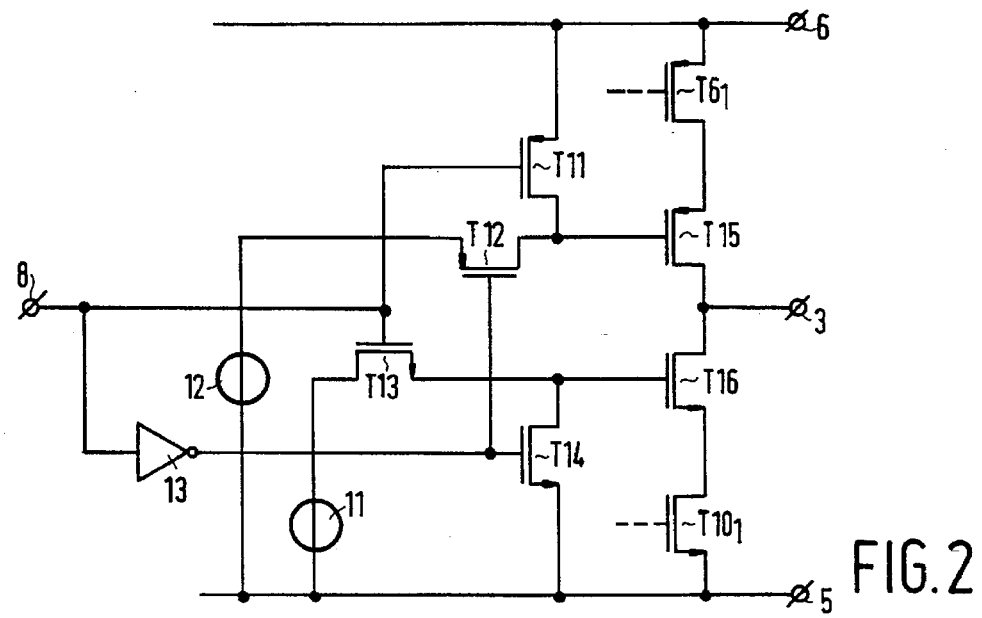
FIG. 2 is a circuit diagram of a switching block for use in the transconductance amplifier of FIG. 1.

FIG. 2 shows a switching block for use in the transconductance amplifier of FIG. 1. The switching block comprises the switches $S1_1$ and $S2_1$, which are realised by transistors T15 and T16 respectively. For each of the other pair of switches $(S1_2, S2_2), \ldots (S1_N, S2_N)$, similar switching blocks are provided. The switching block further comprises a control terminal 8, which controls the switches $S1_1$ and $S2_1$, an inverter 13 for inverting the voltage on said control terminal 8, transistors T11 . . . T14 and voltage sources 11 and 12. Transistors T11, T12 and T15 are P-channel MOS transistors and transistors T13, T14, T16 are N-channel MOS transistors. A source of transistor T15 is connected to the drain of transistor $T6_1$ and a source of transistor T16 is connected to the drain of transistor $T10_1$. The drains of transistors T15 and T16 are connected to the output terminal 3. The gate of transistor T15 is connected to the drains of transistors T11 and T12. The gate of transistor T16 is connected to the drain of transistor T14 and the source of transistor T13. The source of transistor T12 is connected to the voltage source 12 and the drain of transistor T13 is connected to the voltage source 11. The control terminal 8 is connected to the gates of transistors T11 and T13 and to the input of the inverter 13. The output of the inverter is connected to the gates of transistors T12 and T14. The sources of transistors T11 and T14 are connected to the power supply terminals 6 and 5 respectively. When the voltage on control terminal 8 is high (approximately equal to the voltage of power supply terminal 6) transistor T13 will become conductive, thus making transistor T16 conductive by biasing its gate with an appropriate voltage supplied by the voltage source 11. The voltage on control terminal 8 is inverted by the inverter 13 to a voltage approximately equal to the voltage of power supply terminal 5. Thus transistor T12 will become conductive, making transistor T15 conductive by biasing its gate with an appropriate voltage supplied by the voltage source 12. Transistors T14 and T11 are not conductive due to their respective gate voltages. As transistors T15 and T16 are conductive, the currents supplied by transistors $T6_1$ and $T10_1$ will be allowed to flow through transistors T15 and T16 and to the output terminal 3. When the voltage on control terminal 8 is low (approximately equal to the voltage of power supply terminal 5) transistors T12 and T13 will be not-conductive, whereas transistors T11 and T14 will be conductive, thus coupling the gates of transistors T15 and T16 to the power supply terminals 6 and 5 respectively, thereby making transistors T15 and T16 not-conductive and thus no current will flow through these transistors. Control terminal 8 is one of N control terminals, which together form the transconductance control input 4 of the transconductance amplifier. It is also possible to activate only one pair of switches $S1_i$, $S2_i$ at a time. Now only P control bits are needed in the transconductance control signal, where P equals the closest integer to but not smaller than $^2\log(N)$, but a P-to-N decoder is required to control the N pairs of switches. In FIG. 2 the connection of the drain and the source of transistors T12 and T13 can be interchanged as hardly no current will flow through these transistors, thereby making the difference between drain and source meaningless.

Figure 3:
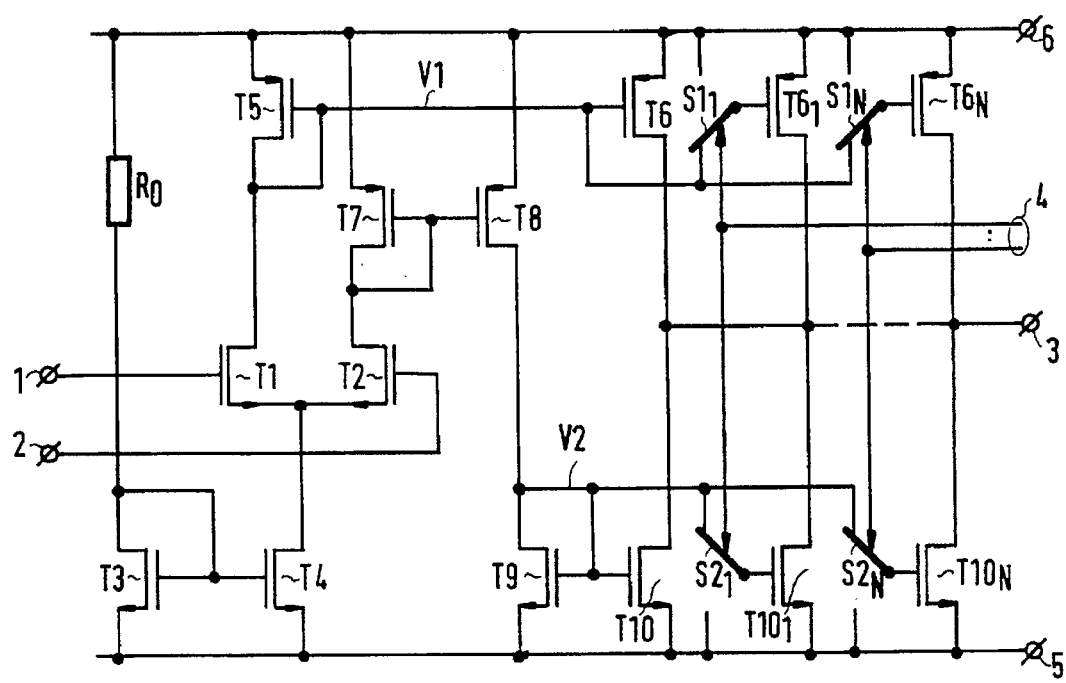
FIG. 3 is a circuit diagram of a second embodiment of a transconductance amplifier according to the invention using MOS transistors.

FIG. 3 shows a second embodiment of a transconductance amplifier according to the invention using MOS transistors. The embodiment in FIG. 3 differs from the embodiment of FIG. 1 in the following. The drains of transistors $T6_1 \ldots T6_N$, $T10_1 \ldots T10_N$ are now connected directly to the output terminal 3. The gates of transistors $T6_1 \ldots T6_N$ are selectively coupled to a bias voltage V1 as present on the gate of transistor T5 or to the power supply terminal 6 via the switches $S1_1 \ldots S1_N$ respectively. The gates of transistors $T10_1 \ldots T10_N$ are selectively coupled to a bias voltage V2 as present on the gate of transistor T9 or to the power supply terminal 5 via the switches $S2_1 \ldots S2_N$ respectively. Thus the currents through transistors $T6_1 \ldots T6_N$, $T10_1 \ldots T10_N$ can be selectively switched off by coupling selectively the gates of said transistors to a power supply terminal. In FIGS. 1 and 3 transistors T6 and T10 are directly connected to the output terminal 3. This is to provide a minimum value for the transconductance. By making the output currents of transistors T6 and T10 switchable as well, the value of the transconductance can be made substantially equal to zero.

Figure 4:
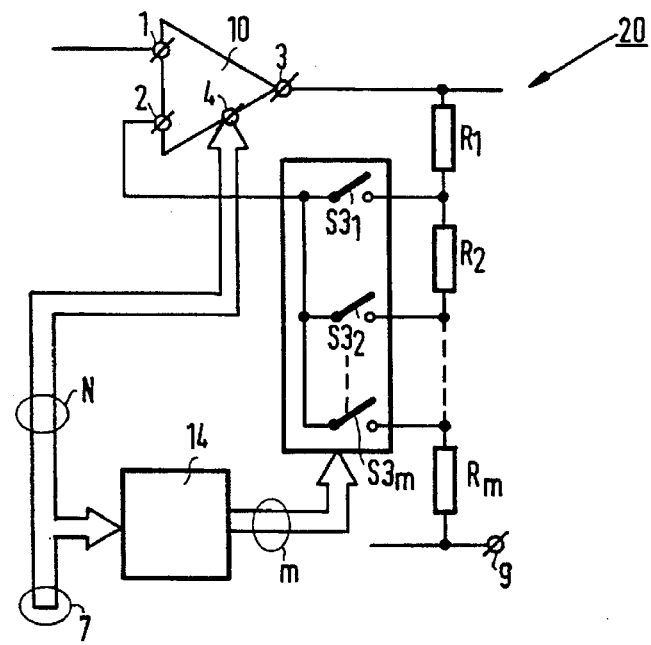
FIG. 4 is a block diagram of a variable gain stage according to the invention.

FIG. 4 shows a diagram of a variable gain stage according to the invention. The variable gain stage comprises a transconductance amplifier 10 as shown for example in FIG. 1 or FIG. 3. The non-inverting input terminal (1) receives an input signal. The output terminal 3 of the transconductance amplifier is coupled to a reference terminal 9 via a resistive ladder, comprising resistors R1 ... RM. The negative input terminal 2 can be selectively connected to one of the taps of the ladder by switches $S3_1 \ldots S3_M$, thereby fixing the gain of the variable gain stage. When a capacitive load is connected to the output terminal 3, the bandwidth of the variable gain stage is proportional to the transconductance of the transconductance amplifier 10 and proportional to the value of the resistance as seen between the output terminal 3 and the inverting input terminal 2. This means that the bandwidth changes if the gain of the variable gain stage and thus the resistance between terminals 2 and 3 changes. This can lead to instability at very low gain values (approaching unity gain) in which the resistance between terminals 2 and 3 becomes small. This instability is caused by the increase in bandwidth of the variable gain stage. To avoid instability the bandwidth can be reduced by decreasing the transconductance of the transconductance amplifier 10 when the gain of the variable gain stage is lowered. Another advantage of reducing the transconductance at low gain values is that a reduction of the transconductance will result in a reduction in power consumption as well, since less output branches will supply currents, and said currents comprise a common-mode current component and a differential current component. This common-mode current component, which does not appear at the output terminal 3, is mainly responsible for the power consumption of the transconductance amplifier. Thus any reduction of the number of output branches will result in a lower power consumption. Only when a high gain is required will there be a high power consumption. The variable gain stage comprises a gain control input 7 for digitally controlling the switches $S3_1 \ldots S3_M$ so that only one switch at a time is conductive, and for digitally controlling the transconductance simultaneously. For this purpose an N-to-M decoder 14 is provided for translating the N bit control signal at the gain control input 7 to an M bit control signal for controlling said switches $S3_1 \ldots S3_M$, of which M bits only 1 bit at a time is high, meaning that only one switch at a time is conductive.

Figure 5:
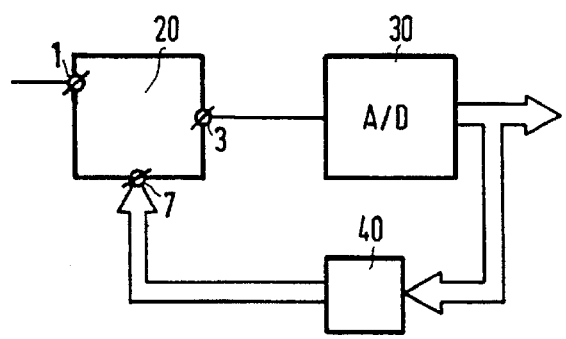
FIG. 5 is a block diagram of an automatic gain control circuit according to the invention.

FIG. 5 shows an automatic gain control circuit according to the invention. The output terminal 3 of the variable gain stage 20 of FIG. 4 is coupled to an analogue input of an analogue-to-digital converter 30, which converts the analogue output signal of the variable gain stage into a digital output signal. This digital output signal is supplied to a digital peak detector 40, which compares the amplitude of the digital output signal with a reference value and outputs a binary gain control signal to the gain control input 7 of the variable gain stage 20. If the amplitude of the digital control signal exceeds the reference value the gain of the variable gain stage 20 will be reduced and the transconductance of the transconductance amplifier 10 will be reduced as well. If the amplitude of the digital output signal is lower than the reference value the gain of the variable gain stage 20 and the transconductance of the transconductance amplifier 10 will be increased. It will be obvious to a person skilled in the art that a more elaborate peak detector can be used in the automatic gain control circuit without departing from the scope of the present invention.

The invention is not limited to the embodiments as shown previously. The transistors can also be of a bipolar type. The current mirrors are not restricted to the type as shown. A person skilled in the art can realise the invention with other current mirrors without departing from the scope of the present invention, for example, by adding transistors in cascade with transistors T3...T10 and even in cascade with T6$_1$...T6$_N$, T10$_1$...T10$_N$. The invention is also not limited to embodiments having a single output terminal. It is obvious for the person skilled in the art to realise a transconductance amplifier having a symmetrical output, for example, by duplicating the first, second and third current mirrors, whereby the first and second differential outputs of the differential stage are interchangeably coupled to the duplicates of the first and second current mirrors. Furthermore, it is also possible to place the switches S1$_1$...S1$_N$, S2$_1$...S2$_N$ in series with the sources of transistors T6$_1$...T6$_N$, T10$_1$...T10$_N$. The switching block as shown in FIG. 2 is only intended as an illustration of the realisation of the switches S1$_1$...S1$_N$, S2$_1$...S2$_N$ and is not meant as a limitation of the scope of the invention.

I claim:

1. A variable gain stage comprising: a transconductance operational amplifier having a non-inverting and an inverting input terminal, an output terminal and a gain control input, said gain stage comprising a resistive ladder coupled between said output terminal and a reference terminal, said inverting input terminal being selectively connectable to one of a plurality of taps of said resistive ladder in response to a binary gain control signal applied to said gain control input for digitally controlling the gain of said variable gain stage, wherein said transconductance operational amplifier comprises:

a differential stage having first and second inputs coupled to respective ones of said input terminals, a first differential output coupled to said output terminal via a first output branch of a first current mirror and a second differential output coupled to said output terminal via a second current mirror and a first output branch of a third current mirror, wherein said first and third current mirrors comprise further output branches, the further output branches being selectively coupled to said output terminal for selectively supplying output currents to said output terminal in response to a binary transconductance control signal applied to said gain control input, and wherein the transconductance of said transconductance amplifier is variable in accordance with a change in the gain of said variable gain stage.

2. The variable gain stage of claim 1, wherein said binary gain control signal and the binary transconductance control signal are the same signal.

3. An automatic gain control circuit comprising: a variable gain stage coupled to a peak detector, an output signal of said peak detector being applied to a gain control input of said variable gain stage, wherein said variable gain stage is coupled to said peak detector via an A/D converter and said variable gain stage comprises the variable gain stage of claim 2.

4. An automatic gain control circuit comprising: a variable gain stage coupled to a peak detector, an output signal of said peak detector being applied to a gain control input of said variable gain stage, wherein said variable gain stage is coupled to said peak detector via an A/D converter and said variable gain stage comprises the variable gain stage of claim 1.

5. A variable gain stage comprising: a transconductance operational amplifier having a non-inverting and an inverting input terminal, an output terminal and a gain control input, said gain stage comprising a resistive ladder coupled between said output terminal and a reference terminal, said inverting input terminal being selectively connectable to one of a plurality of taps of said resistive ladder in response to a binary gain control signal applied to said gain control input for digitally controlling the gain of said variable gain stage, wherein said transconductance operational amplifier comprises:

a differential stage having first and second inputs coupled to respective ones of said input terminals, a first differential output coupled to said output terminal via a first output branch of a first current mirror and a second differential output coupled to said output terminal via a second current mirror and a first output branch of a third current mirror, wherein said first and third current mirrors comprise further output branches, the further output branches being selectively coupled to said output terminal via respective switches for selectively supplying output currents to said output terminal in response to a binary transconductance control signal applied to said gain control input, and wherein the transconductance of said transconductance amplifier is variable in accordance with a change in the gain of said variable gain stage.

6. The variable gain stage of claim 5, wherein said binary gain control signal and the binary transconductance control signal are the same signal.

* * * * *